(12) United States Patent
Fang et al.

(10) Patent No.: US 9,755,151 B2
(45) Date of Patent: Sep. 5, 2017

(54) ORGANIC SEMICONDUCTORS

(75) Inventors: Junfeng Fang, Ningbo (CN); Feng Gao, Linkoping (SE); Bodo Wallikewitz, Bruehl (DE); Giuseppina Pace, Rome (IT); Richard Henry Friend, Fulbourn (GB); Wilhelmus T. S. Huck, Beek-Ubbergen (NL)

(73) Assignee: CAMBRIDGE ENTERPRISE LIMITED, Cambridge, MA (US)

( * ) Notice: Subject to any disclaimer, the term of this patent is extended or adjusted under 35 U.S.C. 154(b) by 1012 days.

(21) Appl. No.: 13/995,157

(22) PCT Filed: Dec. 16, 2011

(86) PCT No.: PCT/GB2011/052503
§ 371 (c)(1),
(2), (4) Date: Aug. 14, 2013

(87) PCT Pub. No.: WO2012/080750
PCT Pub. Date: Jun. 21, 2012

(65) Prior Publication Data
US 2013/0313544 A1    Nov. 28, 2013

(30) Foreign Application Priority Data

Dec. 16, 2010   (GB) .................................. 1021382.5

(51) Int. Cl.
*H01L 51/54*   (2006.01)
*C09K 11/06*   (2006.01)
(Continued)

(52) U.S. Cl.
CPC ........ *H01L 51/005* (2013.01); *H01L 51/0039* (2013.01); *H01L 51/5072* (2013.01);
(Continued)

(58) Field of Classification Search
CPC ........ C08G 61/00; C08G 61/02; C08G 61/10; C08G 61/12; C08G 2261/00;
(Continued)

(56) References Cited

U.S. PATENT DOCUMENTS 5,641,859 A * 6/1997 Chen .................. C08G 73/0266
528/373
6,611,096 B1 * 8/2003 McCormick ........ H01L 51/0035
313/506
(Continued)

FOREIGN PATENT DOCUMENTS

EP         1 734 595 A2     12/2006
JP         2001-076877 A    3/2001
(Continued)

OTHER PUBLICATIONS

Duan et al. Adv. Mater. 2011, 23, 1665-1669. Dat of publication: Feb. 22, 2011.*
(Continued)

*Primary Examiner* — Andrew K Bohaty
(74) *Attorney, Agent, or Firm* — Marshall, Gerstein & Borun LLP

(57) ABSTRACT

An optoelectronic device comprising a charge transfer layer including a first semiconductive polymer comprising one or more zwitterions.

24 Claims, 5 Drawing Sheets

Conditions: i) Pd(PPh$_3$)$_4$, 2M K$_2$CO$_3$, toluene, reflux, 3 days;
ii) THF/Methanol, 1,4-butane sultone, 70°C, 3 days

(51) Int. Cl.
*H01L 51/00* (2006.01)
*H01L 51/50* (2006.01)

(52) U.S. Cl.
CPC ......... *H01L 51/5092* (2013.01); *Y02E 10/549* (2013.01); *Y02P 70/521* (2015.11)

(58) Field of Classification Search
CPC ............ C08G 2261/11; C08G 2261/12; C08G 2261/124; C08G 2261/14; C08G 2261/147; C08G 2261/514; C08G 2261/516; H01L 51/0032; H01L 51/0034; H01L 51/0039; H01L 51/0043; H01L 51/005; H01L 51/50; H01L 51/5048; H01L 51/5072; H01L 51/5088; H01L 51/5092; Y02P 70/521; Y02E 10/549
USPC ....... 428/690, 691, 917, 411.4, 336; 427/58, 427/66; 257/40, 88–104, 257/E51.001–E51.052; 313/500–512; 438/46, 93; 252/301.16–301.35
See application file for complete search history.

(56) References Cited

U.S. PATENT DOCUMENTS

| | | |
|---|---|---|
| 2004/0127666 A1 | 7/2004 | Inbasekaran et al. |
| 2004/0260047 A1* | 12/2004 | Chen ...................... C09K 11/06 528/4 |
| 2006/0054886 A1* | 3/2006 | Bazan .................. C08G 61/124 257/40 |
| 2009/0203876 A1 | 8/2009 | Grand et al. |

FOREIGN PATENT DOCUMENTS

| | | |
|---|---|---|
| WO | WO-01/18888 A1 | 3/2001 |
| WO | WO-2010/125403 A1 | 11/2010 |

OTHER PUBLICATIONS

Huang et al. Journal of Polymer Science: Part A: Polymer Chemistry, 2006, 44, 2521-2532. Year of publication: 2006.*
Wang et al. Applied Physics Letters 2006, 89, 151115-1-151115-3. Date of publication: Oct. 10, 2006.*
Ajayaghosh, "Chemistry of Squaraine-Derived Materials: Near-IR Dyes, Low Band Gap Systems, and Cation Sensors," *Accounts of Chemical Research*, 38(6):449-459 (2005).
Krebs et al., "Dye Sensitized Photovoltaic Cells: Attaching Conjugated Polymers to Zwitterionic Ruthenium Dyes," *Solar Energy Materials and Solar Cells*, 90(18):142-165 (2005).
International Preliminary Report on Patentability for Application No. PCT/GB2011/052503, dated Jun. 18, 2013.
International Search Report and Written Opinion for Application No. PCT/GB2011/052503, dated Mar. 6, 2012.
Search Report for Application No. GB1020382.5, dated Apr. 15, 2011.
Heeger et al., "Making sense of polymer-based biosensors," PNAS, 96(22):12219-12221 (1999).

* cited by examiner

Conditions: i) Pd(PPh$_3$)$_4$, 2M K$_2$CO$_3$, toluene, reflux, 3 days;
ii) THF/Methanol, 1,4-butane sultone, 70°C, 3 days

ORGANIC SEMICONDUCTORS

This invention relates to organic semiconductors and, in particular, although not exclusively, to polymeric semiconductors which are usable in optoelectronic, e.g. photoresponsive, devices.

Semiconducting organic materials make remarkably effective substitutes for conventional inorganic semiconductors in a range of optoelectronic devices including light emitting diodes (LEDs), photovoltaic (PV) diodes, field effect transistors (FETs), and lasers. Among the general class of organic semiconductors, conjugated polymers exemplify the considerable material advantages that organic semiconductor may have over inorganic semiconductors including chemically tunable optoelectronic properties and low-temperature, solution-based processing suitable for printed electronics.

Conjugated polyelectrolytes (CPEs), which comprise a semiconductive polymer backbone having charge sites pendant therefrom and counterions associated with those charge sites, have been shown to be in optoelectronic devices, for example as when used as charge transport (e.g. electron transport or electron injection) materials. In particular, the electronic properties of the CPEs, in combination with their solubility in polar solvents, makes them attractive candidates for materials in e.g. LEDs and PVs.

However, optoelectronic devices including CPEs have slow turn-on times. Without wishing to be bound by any particular theory, it is postulated that this is at least in part owing to the migration of the counter ions, which may also lead to redistribution of the internal field. Moreover, these mobile counter ions also appear to make the device operation mechanism more complicated, as they may alter the work function of the one or both of the electrodes. Furthermore, in OLEDs, for example, the counter ions may impact on the doping characteristics of the light emitting layer.

It is an object of the present invention to provide materials for electronic devices having the advantages of CPEs, while minimising drawbacks such as those described above. It is a further object of the present invention to provide electronic devices including such materials.

In a first aspect, the invention provides an optoelectronic device comprising a charge transfer layer including a first semiconductive polymer comprising one or more zwitterions.

In a second aspect, the invention provides an optoelectronic device comprising a charge transfer layer including a first semiconductive polymer comprising one or more zwitterions covalently attached to the polymer.

In this specification, the term "zwitterion" shall denote a moiety which exists in a stable, charge neutral form having at least one formal positive charge centre and at least one negative charge centre.

In this specification, the term "zwitterionic substituent" refers to a distinct moiety having zwitterionic character attached to a molecule (e.g. a polymer).

Preferably, the one or more zwitterions are covalently attached to the semiconductive polymer backbone.

Preferably, the first semiconductive polymer comprises a first repeat unit having at least one zwitterionic substituent.

Preferably the zwitterionic substituent comprise at least one quaternary amine group.

Preferably the zwitterionic substituent comprise a sulfonate group.

Preferably, the zwitterionic substituent comprises a cationic centre and an anionic centre separated by at least 1, e.g. 2, 3, 4, 5, or more atomic (e.g. carbon) centres, for example an integer number between 2 and 20, say 2 and 10.

Preferably, the first repeat unit comprises a fluorene residue.

Preferably, the first repeat unit comprises the structure:

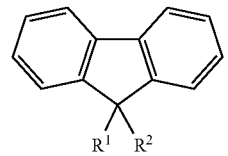

where $R^1$ comprises the or a zwitterionic substituent.

Preferably, $R^2$ comprises the or a zwitterion group (e.g. a different zwitterion group), H or a $C_1$ to $C_{10}$ straight or branched alkyl, alkenyl or alkynyl chain.

More preferably, $R^1$ and $R^2$ both comprise zwitterionic substituents, e.g. the same zwitterionic substituents.

Preferably, one or more the of the zwitterionic substituents comprises a first cationic charge centre separated from a first anionic charge centre by more than 2 atomic (e.g. carbon) centres.

Preferably, the first semiconductive polymer comprises a second repeat unit.

Preferably the second repeat unit comprises a fluorene residue, e.g. 9,9-dioctylfluorene.

Preferably the first semiconductive polymer comprises an alternating copolymer of the first repeat unit and the or a second repeat unit.

In some embodiments, the charge transport layer is positioned between a light emissive layer and a cathode, e.g. the charge transport layer is positioned directly adjacent the light emissive layer and/or the cathode.

In other embodiments, the charge transport layer is positioned between a photovoltaic layer and a cathode, e.g. the charge transport layer is positioned directly adjacent the photovoltaic layer and/or the cathode.

Preferably, the cathode comprises one or more materials selected from aluminum, calcium, indium tin oxide (ITO).

Preferably, the charge transport layer (e.g. the electron transport layer) is at least 1 nm (e.g. at least 2 nm, at least 5 nm, at least 7 nm or at least 9 nm) thick.

Preferably, the charge transport layer (e.g. the electron transport layer) is between 1 nm and 20 nm thick. More preferably, the echarge transport layer is between 2 nm and 10 nm thick.

In a further aspect, the invention provides a semiconductive polymer comprising a first repeat unit having at least one zwitterionic substituent, where the zwitterionic substituent comprises a first cationic charge centre separated from a first anionic charge centre by more than 2 atomic (e.g. carbon) centres.

Preferably the zwitterionic substituent comprise at least one quaternary amine group.

Preferably the zwitterionic substituent comprise a sulfonate group.

Preferably, the first repeat unit comprises a fluorene residue.

Preferably, the first repeat unit comprises the structure:

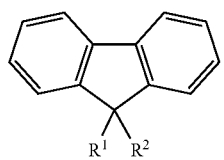

where $R^1$ comprises the or a zwitterionic substituent.

Preferably, $R^2$ comprises the or a zwitterion group (e.g. a different zwitterion group), H or a $C_1$ to $C_{10}$ straight or branched alkyl, alkenyl or alkynyl chain.

More preferably, $R^1$ and $R^2$ both comprise zwitterionic substituents, e.g. the same zwitterionic substituents.

Preferably, the semiconductive polymer comprises a second repeat unit.

Preferably the second repeat unit comprises a fluorene residue, e.g. 9,9-dioctylfluorene.

Preferably the semiconductive polymer comprises an alternating copolymer of the first repeat unit and the or a second repeat unit.

In a further aspect, the invention provides an electron injection material comprising a semiconductive polymer as described above.

In a further aspect, the invention provides an electron transport material comprising a polymer as described above.

In a further aspect, the invention comprises a method of manufacturing an electrically semiconductive zwitterionic polymer comprising: polymerising at least a first conjugated monomer to form a conductive polymer and reacting the polymer with at least one zwitterion forming reactant to form the conductive zwitterionic polymer.

Preferably, the first conjugated monomer comprises at least one tertiary amine substitution, e.g. such that the semiconductive polymer formed therefrom comprises a tertiary amine substituted polymer.

Preferably, the first zwitterion forming reactant comprises a negative charge carrying species or precursor thereof, for example for reacting with the or a tertiary amine group.

Preferably the negative charge carrying species or precursor thereof comprises a sulfone.

Preferably the method comprises copolymerising the first monomer with at least one further monomer, e.g. an amine free monomer.

Preferably the polymerisation comprises a Suzuki polymerisation.

In some embodiments, the polymerisation comprises a Yamamoto or Stille polymerisation.

In order that the invention is better understood, it will now be described by way of example only, with reference to the following drawings, in which.

Figure 1:
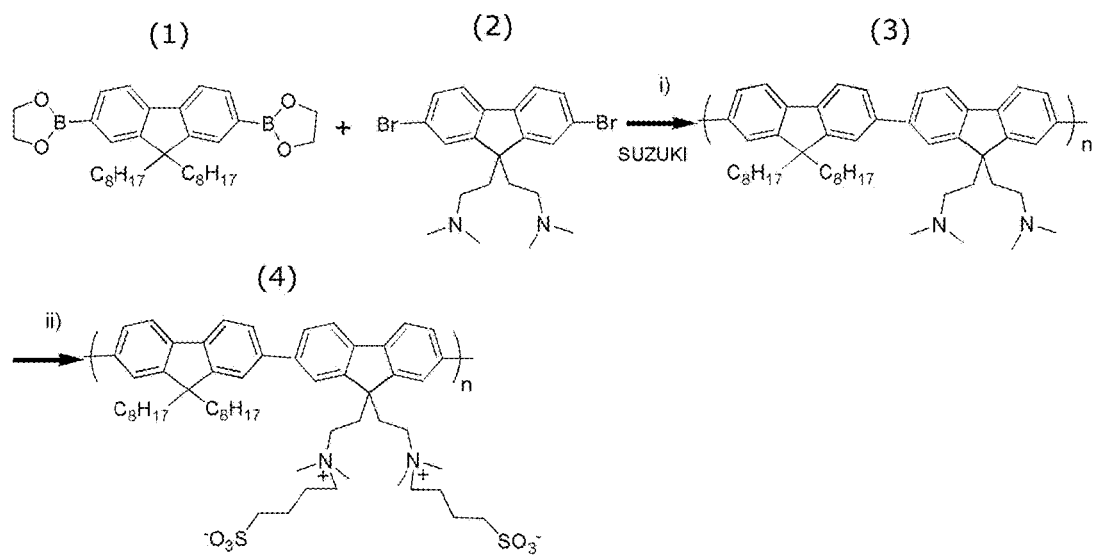
FIG. 1 shows a synthetic pathway for a conductive polymer according to the invention.

A charge-neutral conjugated polyelectrolyte was synthesised according to the following method.

Neutral tertiary amine polymers were synthesised by Pd-mediated Suzuki condensation polymerisation of 2,7-bis (1,3,2-dioxaborolan-2-yl)-9,9-dioctylyfluorene (1) with 2,7-dibromo-9,9-bis((N,N-dimethylamino)ethanyl) fluorene (2), under conditions as are well known in the art. The neutral tertiary amine polymer (3) so-formed is soluble in organic solvents such as chloroform, THF and toluene, but insoluble in methanol, DMSO and water.

The polymer was then quaternised by refluxing for 3 days at 70° C. in toluene/methanol with 1,4-butane sultone. The resulting zwitterionic conjugated polyelectrolyte (4) was soluble in methanol and DMSO. Elemental analysis of the polyelectrolyte showed a near 100% conversion of the tertiary amines of the first polymer into the sulfobetaine zwitterionic groups.

A synthetic pathway for the above described series of reactions is shown in FIG. 1.

Figure 2:
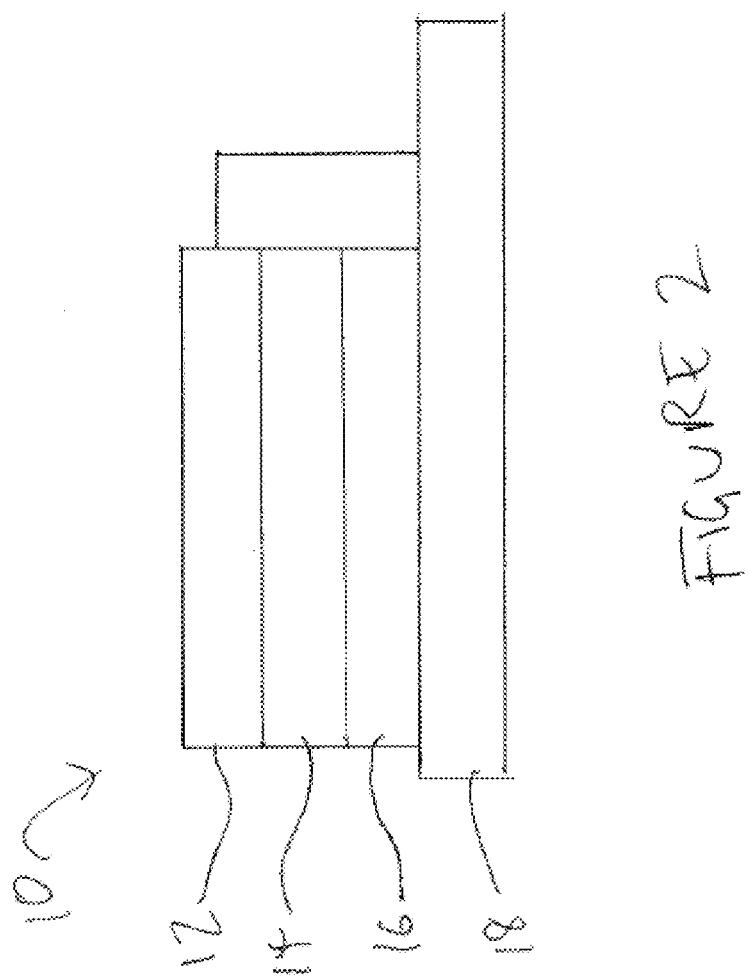
FIG. 2 shows a schematic diagram of an optoelectronic device according to the present invention.

FIG. 2 shows a simple optoelectronic device 10 according to the invention. The device 10 comprises in series an aluminum cathode layer 12, a 2 nm thick electron transfer layer 14 comprising the zwitterionic polyelectrolyte, a 100 nm thick light emissive layer 16 comprising poly(9,9-dioctylfluorene)-co-benothiadazole (F8BT) and an ITO/PEDOT:PSS anode 18.

The device 10 was manufactured by successively spin coating the anode 18, light emissive layer 18 and electron transfer layer 14 onto a glass substrate, followed by depositing the aluminum cathode 12 onto the electron transfer layer 14.

EXAMPLE 1

Figure 3:
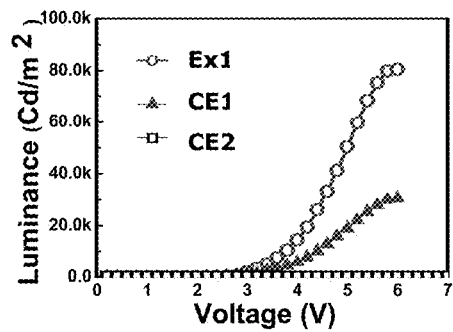
FIG. 3 shows a plot of luminance against voltage for devices according to the invention and the prior art.

The device 10 as described above was tested for luminance against voltage. The results of the test are plotted in FIG. 3. The turn-on voltage (defined as the voltage at which the luminance reached 1 cd/m$^2$) was 2.3V and the brightness increased to 1900 cd/m$^2$ at 3V and a maximum of 80000 cd/m$^2$ at 5.8V.

EXAMPLE 2

Figure 4:
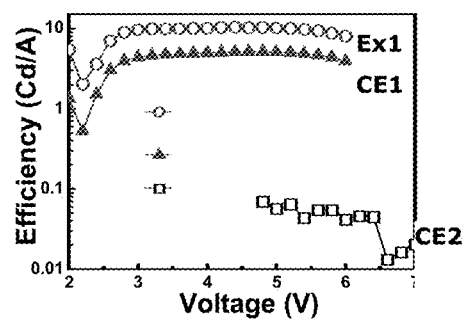
FIG. 4 shows a plot of efficiency against voltage for devices according to the invention and the prior art.

The same device 10 was tested for current efficiency against voltage. The results of the test are plotted in FIG. 4. The efficiency at 5.8V was found to be 8.8 cd/A (the corresponding current density being 910.5 cd/m$^2$), the maximum efficiency being 10.4 cd/A (at a brightness of 26000 cd/m$^2$). It is notable that the device efficiency is stable at operating voltages, with no significant decrease observed up to 5.8V.

COMPARATIVE EXAMPLES

A first comparative device was prepared to comprise, in series, an aluminium/calcium cathode, an F8BT emissive layer and a PEDOT:PSS anode.

A second comparative device was prepared to comprise, in series, an aluminium cathode, an F8BT emissive layer and a PEDOT:PSS anode.

COMPARATIVE EXAMPLE 1

The first comparative device was tested for luminance against voltage and efficiency against voltage. The results are plotted in FIGS. 3 and 4 respectively.

As expected, the first comparative device performed very poorly in both tests, owing to poor electron injection. In particular, it is noted that the turn-on voltage was around 7.5V, far higher than the 2.3V observed for Example 1.

COMPARATIVE EXAMPLE 2

The second comparative device was also tested for luminance against voltage and efficiency against voltage. The results are plotted in FIGS. 3 and 4 respectively.

The turn-on voltage of the second comparative device was found to be substantially the same as that of Example 1, which can be explained by the small difference between the LUMO of F8BT (2.94 eV) and the work function of Ca (2.87 eV). However, the maximum brightness of the second comparative device was found to be only 30,000 cd/m$^2$, less than half of that of the device of Example 1. Moreover, the energy conversion efficiency of the second comparative device was found to be approximately half that observed in Example 2.

EXAMPLE 3

A film of the zwitterionic polyelectrolyte was tested for its absorption (Example 3a) and photoluminescent (Example 3b) properties. The results are plotted in FIGS. 5 and 6 respectively.

COMPARATIVE EXAMPLE 3

A film of the neutral tertiary amine polymer (3) was tested for its absorption (Comparative Example 3a) and photoluminescent (Comparative Example 3b) properties. The results are plotted in FIGS. 5 and 6 respectively.

EXAMPLE 4

A solution of the zwitterionic polyelectrolyte in methanol was tested for its solution absorption (Example 4a) and solution photoluminescent properties (Example 4b). The results are plotted in FIGS. 5 and 6 respectively.

COMPARATIVE EXAMPLE 4

A solution of the neutral tertiary amine polymer (3) in chloroform was tested for its solution absorption (Comparative Example 4a) and solution photoluminescent properties (Comparative Example 4b). The results are plotted in FIGS. 5 and 6 respectively.

Figure 5:
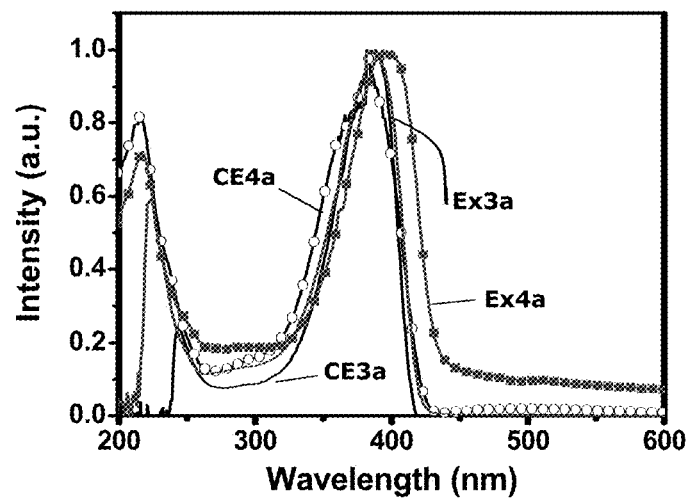
FIG. 5 shows a plot of absorption intensity against wavelength for materials according to the present invention and the prior art.
Figure 6:
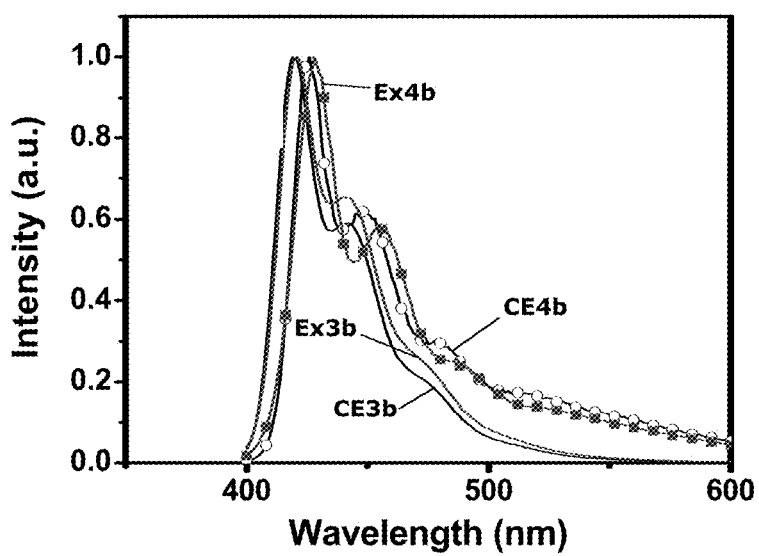
FIG. 6 shows a plot of photoluminescent intensity against wavelength for materials according to the present invention and the prior art.

As can be seen from FIGS. 5 and 6, the film absorption and photoluminescent spectra for the zwitterionic polyelectrolyte and the neutral polymer F8BT are very similar, suggesting that the electronic properties of the zwitterionic polyelectrolyte are not affected by the strong dipole of the zwitterionic side chains.

The HOMO of the zwitterionic polyelectrolyte and F8BT were found, by cyclic voltammetry, each to be 5.6 eV. The corresponding LUMOs were found through the absorption onset to be 2.67 eV and 2.64 eV respectively. These figures might suggest to the skilled person that including an additional zwitterionic polyelectrolyte layer between an aluminium electrode (work function 4.28 eV) and an F8BT emissive layer would in fact increase the electron injection barrier. The opposite has been surprisingly shown to be so.

EXAMPLE 5

An device similar to that tested in Example 1, but having a 7 nm thick electron transfer layer comprising the zwitterionic polyelectrolyte, was tested to measure its luminescence (Example 5a) and current density dynamics (Example 5b) during rectangular 1 Hz voltage pulses of 4.9V. The results are plotted in FIG. 7.

It was observed that the response time at 4.9V was around 10 µs, which is in agreement with the use of metal electrodes. The response time is understood to be faster than response times for other devices utilising conjugated polyelectrolytes as electron injection layers.

EXAMPLES 6 AND 7

Figure 7:
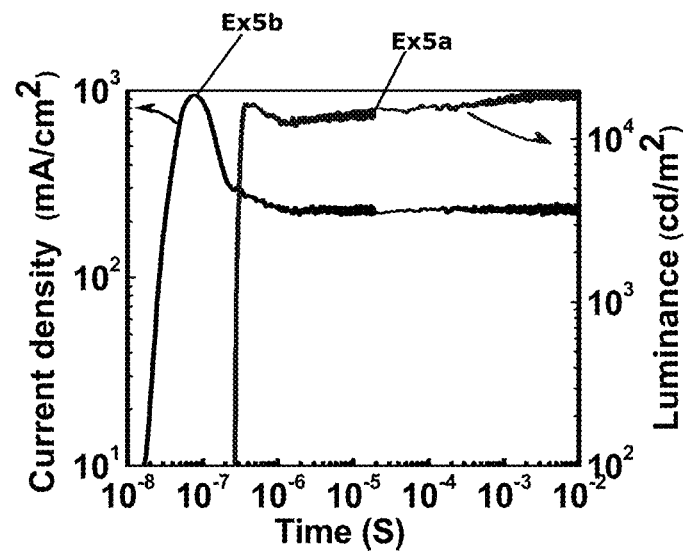
FIG. 7 shows plots of luminescence and current density against time for devices according to the present invention.
Figure 8:
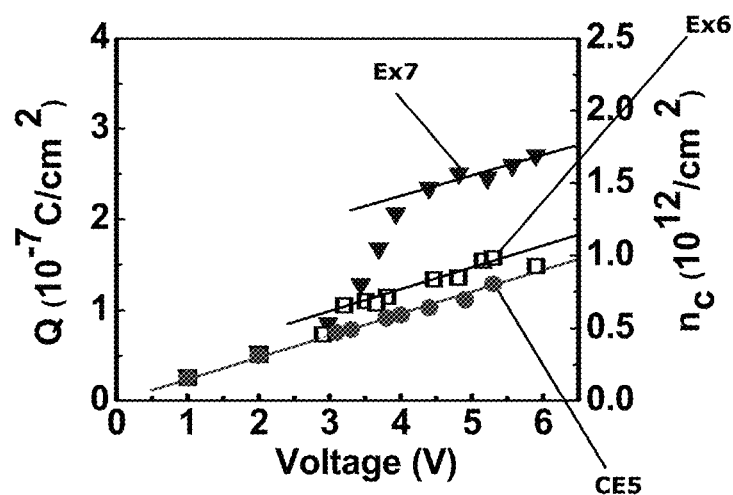
FIG. 8 shows plots of capacitive charge and charge density versus voltage for devices according to the present invention and the prior art.

The time-dependence of the current measured in Example 5 (and as shown in FIG. 7), and equivalent data for a similar device having an electron transfer layer comprising the zwitterionic polymer 10 nm thick (Examples 6 and 7 respectively) are integrated to show charge accumulated in the device. The capacitive charge accumulation and charge density are shown in a plot against voltage in FIG. 8.

COMPARATIVE EXAMPLE 5

Similar current time-dependence data for a standard comparative device was integrated to show charge accumulated in the device. The capacitive charge accumulation and charge density are shown in a plot against voltage in FIG. 8.

These data show that in addition to the capacitive charging of the standard device that rises linearly with voltage, the zwitterion-containing devices shows an extra charging above a threshold near 3 V. Without wishing to be bound by any particular theory, it is postulated that this extra charging arises from reorientation of the zwitterion during the timescale 0-10 µs.

The zwitterionic polyelectrolyte of the invention therefore offers excellent performance as a charge transport material, while maintaining fast switching times and high efficiency, and without compromising emission frequency.

It will be readily appreciated by the skilled person, that alternative or additional ionic species may be incorporated into the polymeric structure. It will be further appreciated that other zwitterionic CPEs and molecular semiconductors (e.g. fullerenes) may be used in the invention outlined herein.

The invention claimed is:

1. An optoelectronic device comprising a charge transfer layer including a first semiconductive polymer comprising one or more zwitterions wherein the first semiconductive polymer consists of a first fluorene repeat unit having at least one zwitterionic substituent and a second fluorene repeat unit, wherein the zwitterionic substituent comprises at least one quaternary amine group and at least one sulfonate group.

2. An optoelectronic device according to claim 1, wherein the zwitterionic substituent comprises a cationic center and an anionic center separated by at least 1 atomic center.

3. An optoelectronic device according to claim 1, wherein the first repeat unit has the structure:

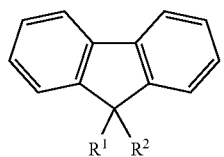

where $R^1$ comprises the zwitterionic substituent and $R^2$ comprises a substituent.

4. An optoelectronic device according to claim 3, wherein $R^2$ comprises a second zwitterionic substituent, H, a $C_1$ to $C_{10}$ straight alkyl chain, a $C_1$ to $C_{10}$ branched alkyl chain, a $C_1$ to $C_{10}$ alkenyl chain, or a $C_1$ to $C_{10}$ alkynyl chain.

5. An optoelectronic device according to claim 3, wherein $R^1$ and $R^2$ comprise the same zwitterionic substituents.

6. An optoelectronic device according to claim 1, wherein the first semiconductive polymer is an alternating copolymer of the first repeat unit and the second repeat unit.

7. An optoelectronic device according to claim 1, wherein the charge transfer layer is positioned between a light emissive layer and a cathode.

8. An optoelectronic device according to claim 1, wherein the charge transfer layer is positioned between a photovoltaic layer and a cathode.

9. An optoelectronic device according to claim 7, wherein the cathode comprises one or more materials selected from the group consisting of aluminum, calcium, indium tin oxide (ITO), gold, and silver.

10. An optoelectronic device according to claim 1, wherein the charge transfer layer is at least 1 nm thick.

11. An optoelectronic device according to claim 10, wherein the charge transfer layer is from 1 nm to 20 nm thick.

12. A semiconductive polymer consisting of a first fluorene repeat unit having at least one zwitterionic substituent and a second fluorene repeat unit, wherein the zwitterionic substituent comprises a first cationic charge center separated from a first anionic charge center by more than 2 atomic centers, wherein the zwitterionic substituent comprises at least one quaternary amine group and at least one sulfonate group.

13. A semiconductive polymer according to claim 12 wherein the first repeat unit has the structure:

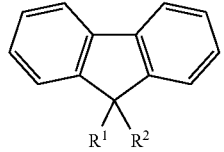

where $R^1$ comprises the zwitterionic substituent and $R^2$ comprises a substituent.

14. A semiconductive polymer according to claim 13, wherein $R^2$ comprises a second different zwitterionic substituent, H, a $C_1$ to $C_{10}$ straight alkyl chain, a $C_1$ to $C_{10}$ branched alkyl chain, a $C_1$ to $C_{10}$ alkenyl chain, or a $C_1$ to $C_{10}$ alkynyl chain.

15. A semiconductive polymer according to claim 13, wherein $R^1$ and $R^2$ comprise the same zwitterionic substituents.

16. A semiconductive polymer according to claim 13, comprising an alternating copolymer of the first repeat unit and the second repeat unit.

17. An electron injection material comprising a semiconductive polymer according to claim 12.

18. An electron transport material comprising a semiconductive polymer according to claim 12.

19. A method of manufacturing an electrically semiconductive zwitterionic polymer comprising:
polymerizing at least a first conjugated monomer and a second conjugated monomer to form a conductive polymer; and,
reacting the polymer with at least one zwitterion forming reactant to form an electrically semiconductive zwitterionic polymer,
the electrically semiconductive zwitterionic polymer consisting of a first fluorene repeat unit having at least one zwitterionic substituent and a second fluorene repeat unit, wherein the zwitterionic substituent comprises at least one quaternary amine group and at least one sulfonate group.

20. A method according to claim 19, wherein the first conjugated monomer comprises at least one tertiary amine substitution.

21. A method according to claim 19, wherein the zwitterion forming reactant comprises a negative charge carrying species or precursor thereof.

22. A method according to claim 21, wherein the negative charge carrying species or precursor thereof comprises a sulfone.

23. A method according to claim 19, wherein the polymerization comprises a Suzuki polymerization.

24. A method according to claim 19, wherein the polymerization comprises a Yamamoto polymerization or a Stille polymerization.

* * * * *